(12) United States Patent
Kim (10) Patent No.: US 9,761,619 B2
(45) Date of Patent: Sep. 12, 2017

(54) CURVED IMAGE SENSOR, METHOD FOR FABRICATING THE SAME, AND ELECTRONIC DEVICE HAVING THE SAME

(71) Applicant: SK hynix Inc., Gyeonggi-do (KR)

(72) Inventor: Sang-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 190 days.

(21) Appl. No.: 14/616,441

(22) Filed: Feb. 6, 2015

(65) Prior Publication Data

US 2016/0126272 A1     May 5, 2016

(30) Foreign Application Priority Data

Oct. 31, 2014 (KR) .................. 10-2014-0149967

(51) Int. Cl.
*H01L 27/00* (2006.01)
*H01L 27/146* (2006.01)

(52) U.S. Cl.
CPC .... *H01L 27/14607* (2013.01); *H01L 27/1469* (2013.01); *H01L 27/14618* (2013.01); *H01L 27/14634* (2013.01); *H01L 27/14636* (2013.01)

(58) Field of Classification Search
CPC ......... H01L 27/14607; H01L 27/14634; H01L 27/14618; H01L 27/1469; H01L 27/14636

USPC ...................................................... 250/208.1
See application file for complete search history.

(56) References Cited

U.S. PATENT DOCUMENTS

| | | | |
|---|---|---|---|
| 6,791,072 B1* | 9/2004 | Prabhu | H01L 27/14601 250/208.1 |
| 2001/0020671 A1* | 9/2001 | Ansorge | H01L 27/14603 250/208.1 |
| 2009/0045510 A1* | 2/2009 | Naya | H01L 23/49816 257/737 |
| 2009/0115875 A1* | 5/2009 | Choi | H01L 27/14618 348/294 |
| 2012/0147207 A1 | 6/2012 | Itonaga | |
| 2014/0160327 A1 | 6/2014 | Enoki et al. | |
| 2016/0172393 A1* | 6/2016 | Kim | H01L 27/14603 348/308 |
| 2016/0286102 A1* | 9/2016 | Sulfridge et al. | H01L 21/00 |

* cited by examiner

*Primary Examiner* — Georgia Y Epps
*Assistant Examiner* — Kevin Wyatt
(74) *Attorney, Agent, or Firm* — IP & T Group LLP (57) ABSTRACT

The curved image sensor may include: a first substrate including a plurality of photoelectric conversion elements and having a curved first surface; a bonding pattern formed over a second surface opposite to the first surface of the first substrate, formed along an edge of the first substrate, and having an opening; a second substrate bonded to the second surface of the first substrate by the bonding pattern; and a sealing material filling the opening so that a cavity defined by the first substrate, the second substrate, and the bonding pattern is sealed by the sealing material.

21 Claims, 6 Drawing Sheets

CURVED IMAGE SENSOR, METHOD FOR FABRICATING THE SAME, AND ELECTRONIC DEVICE HAVING THE SAME

CROSS-REFERENCE TO RELATED APPLICATIONS

This patent document claims priority of Korean Patent Application No. 10-2014-0149967, entitled "CURVED IMAGE SENSOR, METHOD FOR FABRICATING THE SAME AND ELECTRONIC DEVICE HAVING THE SAME" and filed on Oct. 31, 2014, which is incorporated herein by reference in its entirety.

BACKGROUND

Exemplary embodiments relate to a semiconductor device fabrication technology, and more particularly, to a curved image sensor.

In an imaging device such as a camera, an image sensor and an imaging lens are combined. The imaging lens is arranged at a light receiving surface of the image sensor. In such an imaging device, when an object is projected through the imaging lens, the focal positions of the central portion and the peripheral portion of the imaging surface may be different from each other, due to a lens aberration called a field curvature. Thus, the lens aberration such as field curvature, must be corrected.

To solve such a problem, a curved image sensor has been proposed. The curved image sensor has a curved surface which is three-dimensionally curved along the top curved surface of the imaging lens, and the curved surface is set to the imaging surface that is, a light receiving surface, of the image sensor, on which photoelectric conversion elements are arranged.

SUMMARY

Various embodiments are directed to a curved image sensor with improved fabrication efficiency, a method for fabricating the same, and an electronic device including the same.

In an embodiment, a curved image sensor may include: a first substrate including a plurality of photoelectric conversion elements and having a curved first surface; a bonding pattern formed over a second surface opposite to the first surface of the first substrate, formed along an edge of the first substrate, and having an opening; a second substrate bonded to the second surface of the first substrate by the bonding pattern; and a sealing material filling the opening so that a cavity defined by the first substrate, the second substrate, and the bonding pattern is sealed by the sealing material. The curved image sensor may further include a filler filling the cavity.

The first substrate may comprises a device wafer, and the second substrate may comprises a carrier wafer. The bonding pattern may have a donut shape. An outer wall of the bonding pattern may be aligned with sidewalls of the first and second substrates, and an inner wall of the bonding pattern may forms a polygonal shape in which all corners are rounded. The bonding pattern may comprises insulating material. The opening passes through the bonding pattern in a direction parallel to an upper surface of the second substrate.

In an embodiment, a curved image sensor may include: a first substrate including a plurality of photoelectric conversion elements and having a curved first surface; a bonding pattern formed over a second surface opposite to the first surface of the first substrate, formed along an edge of the first substrate, and having an opening; a second substrate bonded to the second surface of the first substrate by the bonding pattern; a logic circuit layer extending between the second substrate and the bonding pattern to between the second substrate and the first substrate; a connector formed in the bonding pattern and suitable for electrically connecting the first substrate and the logic circuit layer; and a sealing material filling the opening to seal a cavity defined by the first substrate, the second substrate, and the bonding pattern. The curved image sensor may further include a filler filling the cavity.

The first substrate may comprises a device wafer, and the second substrate may comprises a carrier wafer. The bonding pattern may have a donut shape. An outer wall of the bonding pattern may be aligned with sidewalls of the first and second substrates, and an inner wall of the bonding pattern may forms a polygonal shape in which all corners are rounded. The bonding pattern may comprises insulating material. The opening passes through the bonding pattern in a direction parallel to an upper surface of the second substrate.

In an embodiment, a method for fabricating a curved image sensor may include: preparing a device wafer having a die region, a neighboring die region, and a scribe lane, wherein the scribe lane is provided between the die region and the neighboring die region; forming a plurality of photoelectric conversion elements in the die region; forming a bonding pattern over a front surface of the device wafer, wherein the bonding pattern is formed along an edge of the die region and includes an opening; bonding the front surface of the device wafer to a carrier wafer by the bonding pattern to form a cavity in the die region, wherein the cavity is defined by the device wafer, the carrier wafer, and the bonding pattern; performing a sawing process to separate the die region from the neighboring die region; and curving the device wafer of the separated die region.

The bonding pattern may have a donut shape. The forming of the bonding pattern may comprises: forming an insulating layer over the front surface of the device wafer; and selectively etching the insulating layer to form the bonding pattern, wherein the bonding pattern is formed over the scribe lane and over the edge of the die region. The opening passes through the bonding pattern in a direction parallel to an upper surface of the carrier wafer. The sawing process may be performed to expose the opening to outside. The curving of the device wafer of the separated die region may comprises: removing air from the cavity to reduce pressure in the cavity; and sealing the cavity by filling the opening with a sealing material. The method may further include: filling the cavity with a filler, before the sealing of the cavity.

In an embodiment, an electronic device may comprises: an optical system; a curved image sensor suitable for receiving light from the optical system; a shutter unit suitable for controlling light irradiated from the optical system to the curved image sensor; a driving unit suitable for controlling an operation of the shutter unit and a transmission operation of the curved image sensor; and a signal processing unit suitable for processing a signal outputted from the curved image sensor. The curved image sensor may include: a first substrate including a plurality of photoelectric conversion elements and having a curved first surface; a bonding pattern formed over a second surface opposite to the first surface of the first substrate, formed along an edge of the first substrate, and having an opening; a second substrate bonded to the second surface of the first substrate by the bonding pattern; and a sealing material filling the opening so that a cavity defined by the first substrate, the second substrate, and the bonding pattern is sealed by the sealing material.

The electronic device may further include: a logic circuit layer extending between the second substrate and the bonding pattern to between the second substrate and the first substrate; and a plurality of connectors formed in the bonding pattern and suitable for electrically connecting the first substrate and the logic circuit layer. The electronic device may further include: a filler filling the cavity.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Various embodiments provide a curved image sensor having improved fabrication efficiency, a method for fabricating the same, and a system including the same. For reference, in currently used fabrication processes a curved image sensor has a curved surface which is three-dimensionally curved along the top curved surface of an imaging lens, and the curved surface is set to an imaging surface, that is, a light receiving surface, of the image sensor, on which photoelectric conversion elements are arranged A typical image sensor will be briefly described below. The image sensor which is a semiconductor device for converting an optical image into an electrical signal may be divided into a Charge Coupled Device ("CCD") image sensor and a Complementary Metal Oxide Semiconductor ("CMOS") image sensor. The CMOS image sensor may be driven using a simpler driving method than the CCD image sensor, and employs various scanning methods. Furthermore, circuits for processing signals outputted from pixels may be integrated into one chip through a CMOS process, which makes it possible to reduce the size, fabrication cost, and power consumption of products. Recently, research and development for the CMOS image sensor have been actively conducted. The CMOS image sensor may be divided into a front-side illumination type and a back-side illumination type. The back-side illumination type is known to have better operation characteristics such as, sensitivity, than the front-side illumination type. Thus, the following embodiments according to the present invention will be focused on the back-side illumination type CMOS image sensor.

Figure 1:
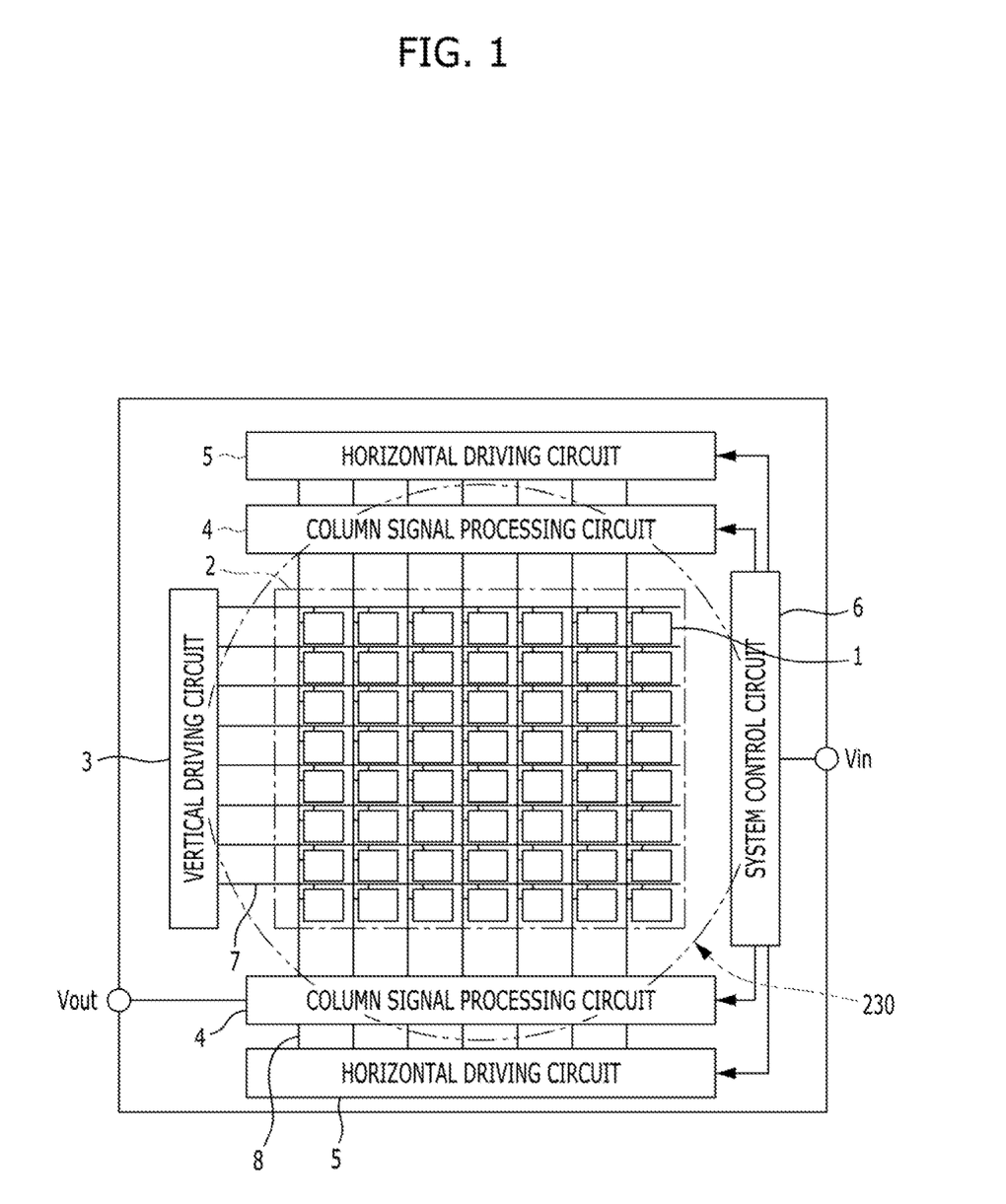
FIG. 1 is a diagram of a curved image sensor in accordance with an embodiment.

FIG. 1 is a diagram of a curved image sensor in accordance with an embodiment.

As illustrated in FIG. 1, the image sensor in accordance with an embodiment may include a pixel array 2 in which a plurality of pixels each including a photoelectric conversion element are two-dimensionally arranged. Each of the pixels 1 arranged in the pixel array 2 may be coupled to a pixel circuit (not illustrated) including a plurality of transistors and capacitors, in addition to the photoelectric conversion element. A plurality of photoelectric conversion elements may share a part of the pixel circuit. Furthermore, the pixel circuit may be provided on the opposite surface on which the photoelectric conversion element is provided.

In the curved image sensor in accordance with an embodiment, a bonding pattern may have a donut shape and be formed along the edges of the pixel array 2. Thus, the center of a cavity defined by a first substrate, a second substrate, and the bonding pattern may be aligned with the center of the pixel array 2. See FIGS. 2B and 3B.

Around the pixel array 2, peripheral circuits may be arranged. The peripheral circuits may include a vertical driving circuit 3, a column signal processing circuit 4, a horizontal driving circuit 5, and a system control circuit 6. The peripheral circuits may be formed on the same substrate as the pixel array 2. See FIGS. 2A and 2B. Alternatively, the peripheral circuits may be formed on a different substrate from the substrate on which the pixel array 2 is formed. In this case, a unit for connecting the pixel array 2 to a peripheral circuit, for example, a connector may be formed in the bonding pattern. See FIGS. 3A and 3B.

The vertical driving circuit 3 may be implemented with a shift register, select a pixel driving line 7 arranged on the pixel array 2, supply a pulse signal for driving a pixel to the selected pixel driving line 7, and drive the pixels arranged in the pixel array 2 on a row basis. That is, the vertical driving circuit 3 may sequentially and selectively scan the pixels arranged in the pixel array 2 in a vertical direction on a row basis. Furthermore, through a vertical signal line 8 arranged perpendicular to the pixel driving line 7, a pixel signal is generated based on a signal charge which is generated in response to the amount of light received by each pixel. The pixel signal may be supplied to the column signal processing circuit 4.

The column signal processing circuit 4 may be arranged at each pixel column, and process signals outputted from the respective pixel column. For example, the column signal processing circuit 4 may perform noise reduction. That is, the column signal processing circuit 4 may perform Correlated Double Sampling ("CDS") for removing fixed pattern noise of pixels, signal amplification, or Analog/Digital Conversion ("ADC").

The horizontal driving circuit 5 may include a shift register, sequentially output horizontal scanning pulses to select the column signal processing circuits 4, and control the column signal processing circuits 4 to output pixel signals. An output circuit may process the signals which are sequentially supplied from the respective column signal processing circuits 4, and output the processed signals. For example, the output circuit may perform only buffering or perform dark level adjustment, row deviation correction, and various digital signal processing operations.

The system control circuit 6 may receive an input clock and data indicating an operation mode or the like, and output data such as, internal information of the image sensor. That is, the system control circuit 6 may generate a clock signal or control signal based on a vertical synchronization signal, a horizontal synchronization signal, and a master clock, which serve as a reference signal for the vertical driving circuit 3, the column signal processing circuit 4, and the horizontal driving circuit 5. The system control circuit 6 may input the clock signal or control signal to the vertical driving circuit 3, the column signal processing circuit 4, the horizontal driving circuit 5 and the like.

Figure 2A:
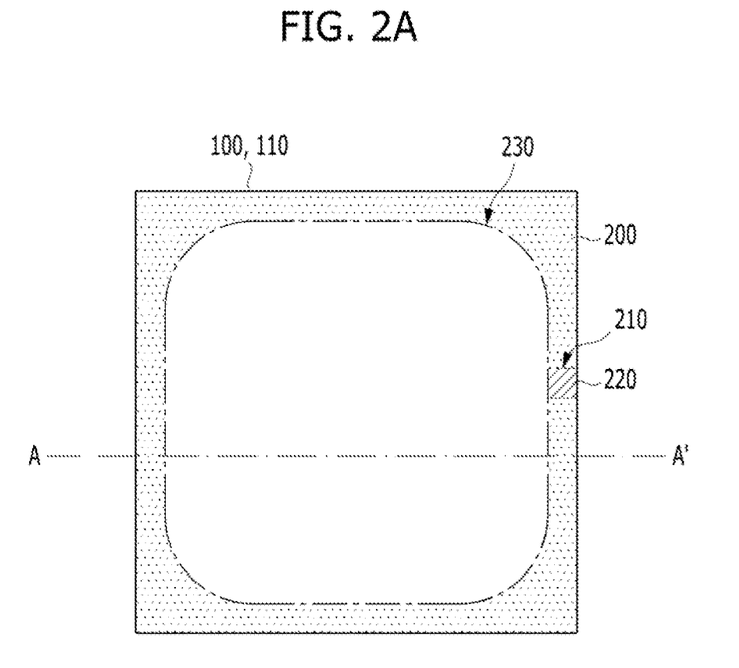
FIG. 2A is a plan view of a curved image sensor in accordance with a first embodiment.
Figure 2B:
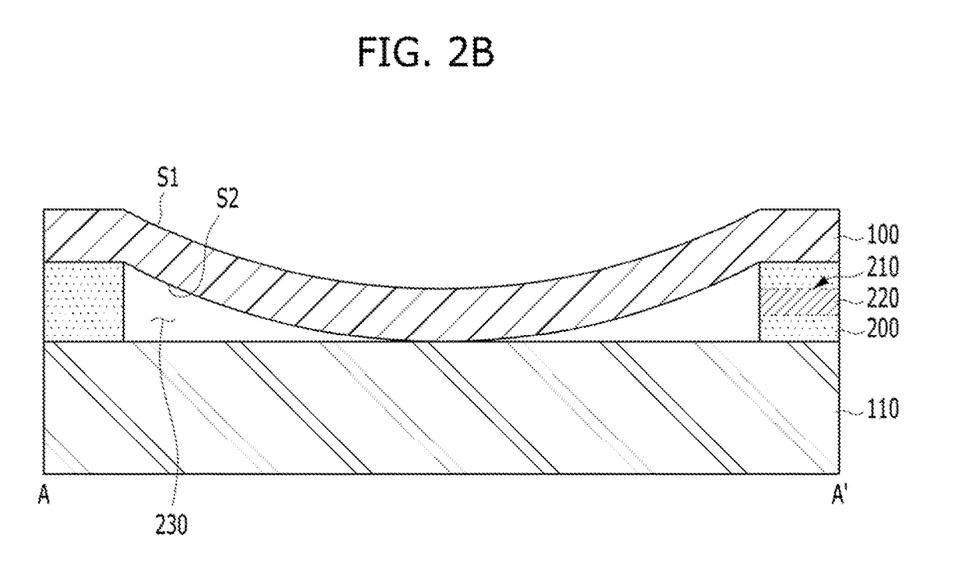
FIG. 2B is a cross-sectional view taken along line A-A' of FIG. 2A.

FIGS. 2A and 2B are diagrams illustrating a curved image sensor in accordance with a first embodiment. FIG. 2A is a plan view, and FIG. 2B is a cross-sectional view taken along the line A-A' of FIG. 2A.

As illustrated in FIGS. 2A and 2B, the curved image sensor in accordance with the first embodiment may include a first substrate 100, a bonding pattern 200, a second substrate 110, and a sealing material 220. The first substrate 100 may include a plurality of photoelectric conversion elements, and have a curved first surface S1. The bonding pattern 200 may be formed over a second surface S2 of the first substrate 100, opposite to the first surface S1 of the first substrate 100, along the edges of the first substrate 100 and have one or more openings 210. The second substrate 110 may be coupled to the first substrate 100 through the bonding pattern 200. The sealing material 220 may gap-fill the one or more openings 210 to seal a cavity 230 defined by the first substrate 100, the second substrate 110, and the bonding pattern 200. Furthermore, the curved image sensor may further include a filler (not illustrated) to gap-fill the cavity 230.

The first substrate 100 may serve as a device wafer, and the second substrate 110 may serve as a carrier wafer or handle wafer. That is, the first substrate 100 may include a substrate separated from the device wafer, and the second substrate 110 may include a substrate separated from the carrier wafer or handle wafer. The first and second substrates 100 and 110 may be thinned through a wafer thinning process. The second substrate 110 may serve as a support member which supports the first substrate 100 having a curved light incident surface. The second substrate 110 and the first substrate 100 are bonded by the bonding pattern 200. Each of the first and second substrates 100 and 110 may include a semiconductor substrate. The semiconductor substrate may have a single crystal state, and include a silicon-containing material. That is, the first and second substrates 100 and 110 may include a single-crystal silicon containing material. For example, the first and second substrates 100 and 110 may include a bulk silicon substrate.

When the image sensor in accordance with an embodiment is implemented in a back-side illumination type device, the curved first surface S1 of the first substrate 100 may be set to the back side of the first substrate 100, which serves as a light incident surface, and the second surface S2 opposite to the first surface S1 may be set to the front side of the first substrate 100. Although not illustrated, the curved image sensor in accordance with the first embodiment may further include an interlayer dielectric layer which is formed on the front side of the first substrate 100, that is, the second surface S2, and includes a signal generation circuit. The interlayer dielectric layer may include any one single layer or two or more layers of oxide, nitride, and oxynitride. The signal generation circuit formed in the interlayer dielectric layer may include a plurality of transistors, multilayer metallic wirings, and a plurality of contact plugs for coupling the plurality of transistors to the multilayer metallic wirings. The signal generation circuit may include the pixel circuits and the peripheral circuits as shown in FIG. 1. Furthermore, the curved image sensor may further include a color filter that corresponds to each of the photoelectric conversion elements and is formed on the back side of the first substrate 100, that is, the first surface S1. Additionally, a microlens may be formed on the color filter.

The photoelectric conversion element may include a photodiode. The photoelectric conversion element may be formed on the first substrate 100. For example, the photoelectric conversion element may include one or more photoelectric conversion units which are formed on the substrate 100 to vertically overlap each other. Each of the photoelectric conversion units may include a P-type impurity region and an N-type impurity region.

The bonding pattern 200 may serve as an adhesive layer for bonding the first substrate 100 to the second substrate 110. Thus, the bonding pattern 200 may include an insulating material. Specifically, the bonding pattern 200 may include oxide, nitride, oxynitride, or a combination thereof. For example, when the first and second substrates 100 and 110 include a silicon containing material, the bonding pattern 200 may include silicon oxide.

The bonding pattern 200 may serve to provide a space, that is, an air cavity 230. The first substrate 100 can be bent to the air cavity 230 to form a curved first surface S1. The center of the pixel array 2 (refer to FIG. 1) of the image sensor may be aligned with the center of the cavity 230. For this structure, the bonding pattern 200 may have a donut shape and be formed along the edges of the first substrate 100. The outer wall of the bonding pattern 200 may be aligned with sidewalls of the first and second substrates 100 and 110. When viewed from the top, the inner wall of the bonding pattern 200 may form a polygonal shape in which the corners are rounded. For example, when viewed from the top, the cavity 230 may be in a circular or elliptical shape.

The bonding pattern 200 may be formed on the second surface S2 of the first substrate 100 or formed on the second substrate 110. In another embodiment, the bonding pattern 200 may be simultaneously formed on the first and second substrates 100 and 110. The bonding pattern 200 formed on the first substrate 100 and the bonding pattern 200 formed on the second substrate 110 may have the same shape or different shapes. For example, both of the bonding patterns 200 formed on the first and second substrates 100 and 110, respectively, may have donut shapes. In another embodiment, the bonding pattern 200 formed on the first substrate 100 may have a donut shape and the bonding pattern 200 formed on the second substrate 110 may have a plate shape.

The bonding pattern 200 may include one or more openings 210 which are extended in a direction parallel to an upper surface of the second substrate 110 that is, in a horizontal direction, and completely pass through the bonding pattern 200. The opening 210 may be used to remove air from the cavity 230 or inject air into the cavity 230 to form the substrate 100 having the curved first surface S1. Furthermore, the opening 210 may be used to inject filler into the cavity 230 or to remove the filler from the cavity 230.

The sealing material 220 filling the opening 210 may serve to seal the cavity 230. As the cavity 230 is sealed by the sealing material 220, the curved shape of the first substrate 100 may be maintained. Furthermore, the filler may serve to further improve the adhesion between the first and second substrates 100 and 110 and more effectively maintain the curved shape of the first substrate 100. The sealing material 220 and the filler may include a variety of commercial materials.

In the curved image sensor in accordance with the first embodiment, the curved surface serves as a light incident surface. The bonding pattern which bonds the first and second substrates 100 and 110 of the curved light incident surface, significantly improves fabrication efficiency. The curved surface remains curved by using the bonding pattern 200 which bonds the first second substrates 100 and 110. Furthermore, a package including the curved image sensor can be reduced in size. This aspect will be more clearly described below in the description of a method for fabricating a curved image sensor. See FIGS. 4A to 4E.

Figure 3A:
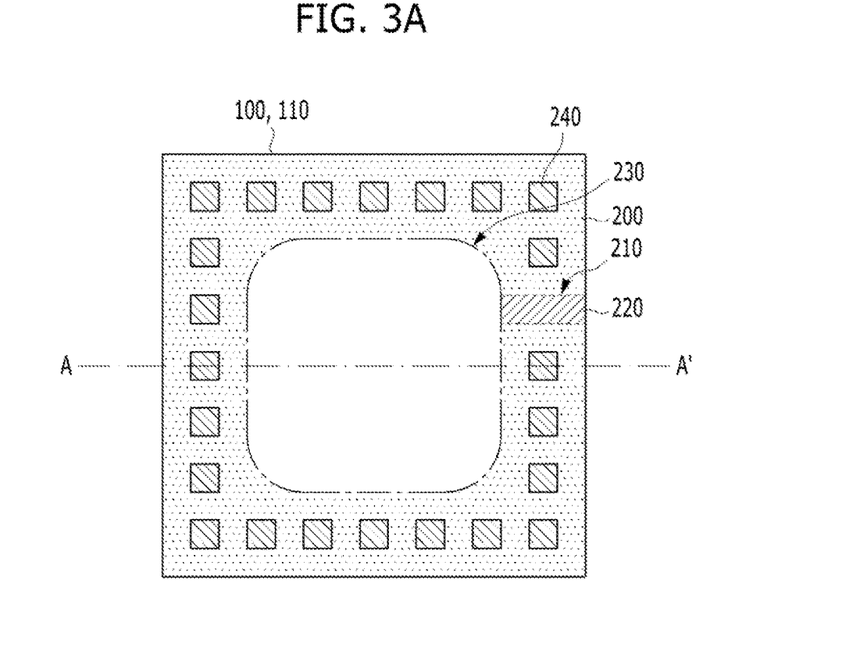
FIG. 3A is a plan view of a curved image sensor in accordance with a second embodiment.
Figure 3B:
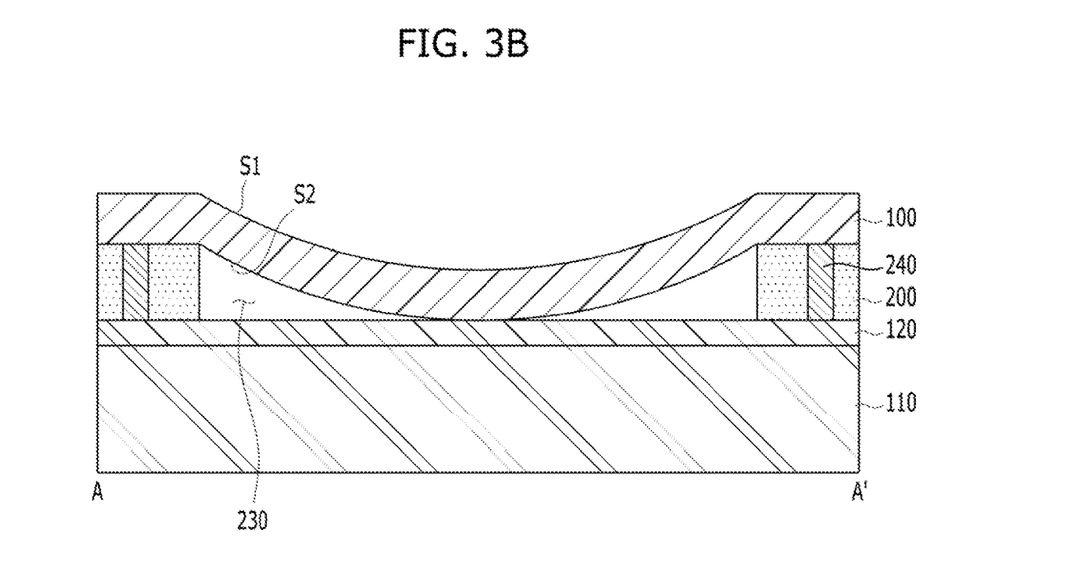
FIG. 3B is a cross-sectional view taken along line A-A' of FIG. 3A.

FIGS. 3A and 3B are diagrams illustrating a curved image sensor in accordance with a second embodiment. FIG. 3A is a plan view, and FIG. 3B is a cross-sectional view taken along the line A-A' of FIG. 3A. In the second embodiment, the same components as those of the first embodiment represent are denoted by like reference numerals, and the detailed descriptions thereof are omitted herein.

As illustrated in FIGS. 3A and 3B, the curved image sensor in accordance with the second embodiment may include a first substrate 100, a bonding pattern 200, a second substrate 110, a logic circuit layer 120, a plurality of connectors 240, and a sealing material 220. The first substrate 100 may include a plurality of photoelectric conversion elements, and have a curved first surface S1. The bonding pattern 200 may be formed on a second surface S2 of the first substrate 100, opposite to the first surface S1, along the edges of the first substrate 100, and have one or more openings 210. The second substrate 110 may be coupled to the first substrate 100 by the bonding pattern 200. The logic circuit layer 120 may be formed on the second substrate 110. The plurality of connectors 240 may be formed in the bonding pattern 200 and electrically connect the logic circuit layer 120 to the first substrate 100 including photoelectric conversion elements. The sealing material 220 may fill the one or more openings 210 to seal a cavity 230 defined by the first substrate 100, the second substrate 110, and the bonding pattern 200. Furthermore, the curved image sensor may further include a filler (not illustrated) to fill the cavity 230.

When the image sensor in accordance with the embodiment is a back-side illumination type device, the curved first surface S1 of the first substrate 100 may be the back side of the first substrate 100 and serve as a light incident surface. The second surface S2 of the first substrate 100, opposite to the first surface S1, may be the front side of the first substrate 100. Although not illustrated, the curved image sensor in accordance with the second embodiment may further include an interlayer dielectric layer which is formed on the front side of the first substrate 100, that is, the second surface S2, and includes a signal generation circuit. The interlayer dielectric layer may include oxide, nitride, oxynitride, or a combination thereof. The signal generation circuit formed in the interlayer dielectric layer may include a plurality of transistors, multilayer metallic wirings, a plurality of contact plugs that couple the plurality of transistors to the multilayer metallic wirings, and a plurality of pads coupled to the connectors. The signal generation circuit may include the pixel circuits and the peripheral circuits which have been described above with reference to FIG. 1. The curved image sensor may further include a color filter which corresponds to each of the photoelectric conversion elements and is formed on the back side of the first substrate 100, that is, the first surface S1. Additionally, a microlens may be formed on the color filter.

The logic circuit layer 120 formed on the second substrate 110 may include the peripheral circuits described above with reference to FIG. 1, or an image processing circuit including an Image Signal Processor ("ISP"). The logic circuit layer 120 may include a plurality of transistors, multilayer metallic wirings, a plurality of contact plugs that couple the plurality of transistors to the multilayer metallic wirings, and a plurality of pads coupled to the connectors, like the above-described signal generation circuit. Furthermore, the logic circuit layer 120 may include an interlayer dielectric layer in which the plurality of transistors, the multilayer metallic wirings, the plurality of contact plugs, and the plurality of pads are formed. The bonding pattern 200 may be in contact with the logic circuit layer 120.

The curved image sensor in accordance with the second embodiment may provide the curved light incident surface using the bonding pattern 200 which bonds the first second substrates 100 and 110, thereby significantly improving the fabrication efficiency. Furthermore, a package including the curved image sensor can be reduced in size. This aspect will be more clearly described in a method for fabricating the curved image sensor. See FIGS. 4A to 4E.

Moreover, since the curved image sensor includes the logic circuit layer 120 and the connectors 240, the integration degree of the curved image sensor may be improved. Thus, the curved image sensor may be reduced in size, and the operating speed may be improved.

FIGS. 4A to 4E are perspective views illustrating a method for fabricating a curved image sensor in accordance with the first embodiment, and are cross-sections taken along the line A-A' of FIG. 2A.

Figure 4A:
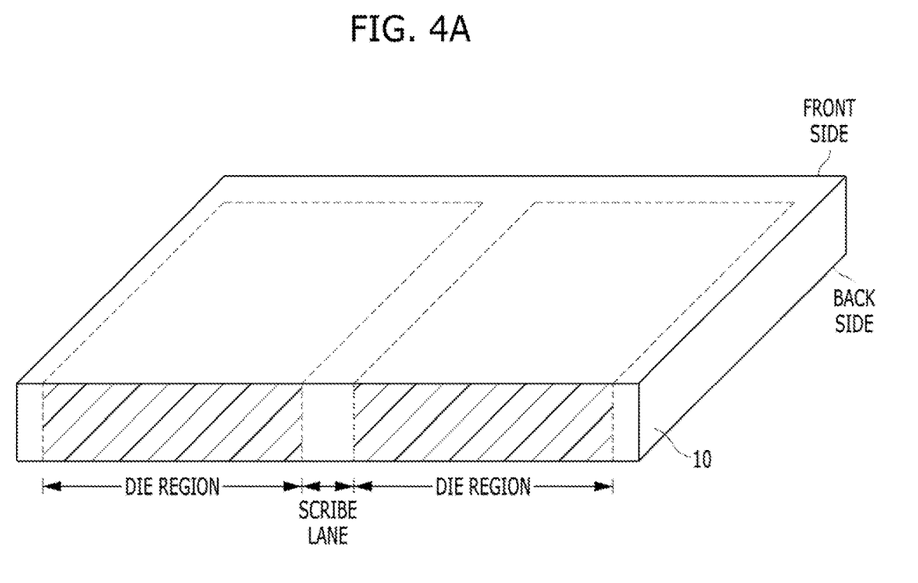
FIGS. 4A to 4E are perspective views illustrating a method for fabricating a curved image sensor in accordance with an embodiment.

As illustrated in FIG. 4A, a device wafer 10 may be prepared to include a plurality of die regions and a scribe lane provided between the plurality of die regions. The scribe lane serves for isolating the plurality of die regions. The device wafer 10 may have a single crystal state, and include a silicon containing material. For example, the device wafer 10 may include a bulk silicon wafer.

Then, an image sensor (not illustrated) including a plurality of photoelectric conversion elements (not illustrated) is formed on each of the die regions. For example, although not illustrated, the plurality of photoelectric conversion elements may be formed on the back side of the device wafer 10, and an interlayer dielectric layer including a signal generation circuit may be formed on the front side of the device wafer 10.

Figure 4B:
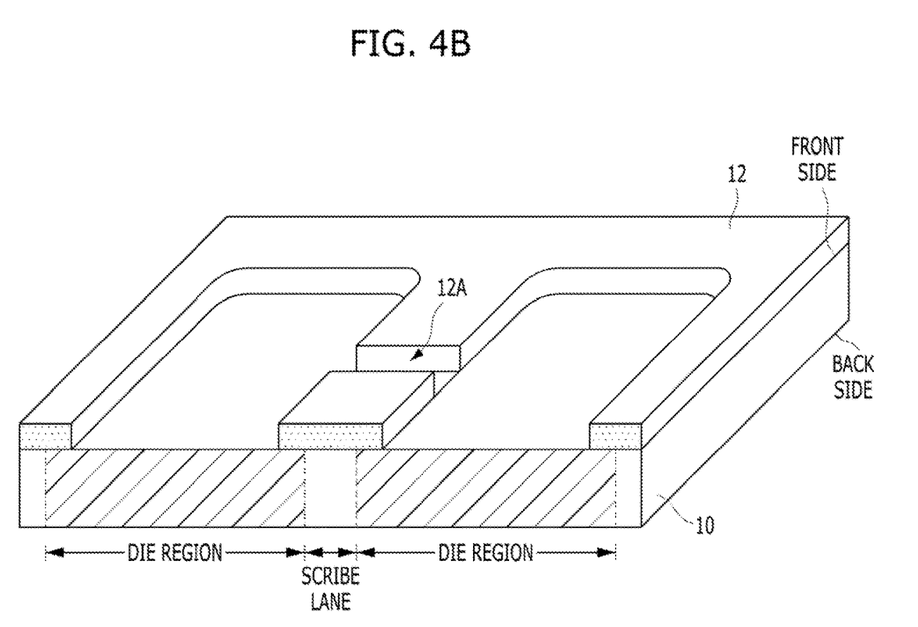

As illustrated in FIG. 4B, a bonding pattern 12 may be formed on the front side of the device wafer 10. The bonding pattern 12 may cover the scribe lane and the edges of each of the die regions. In each die region, the bonding pattern 12 may be formed to have a donut shape. Furthermore, the bonding pattern 12 may include one or more openings 12A. The opening 12A may pass through the bonding pattern 12 in a horizontal direction.

The bonding pattern 12 may include insulating materials, for example, oxide, nitride, oxynitride, or a combination thereof.

Figure 4C:
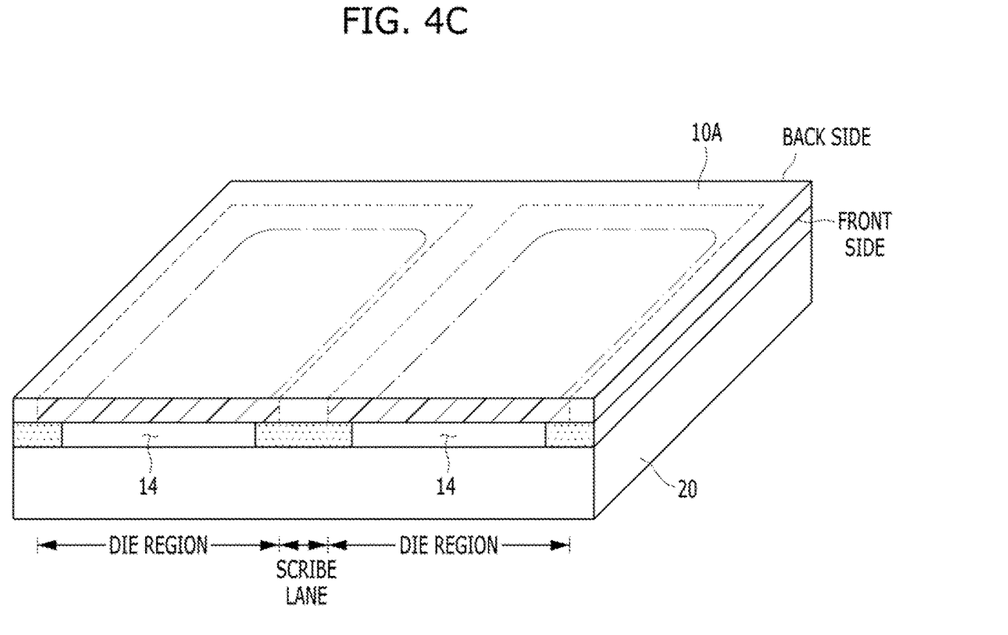

As illustrated in FIG. 4C, a carrier wafer 20 may be prepared. The carrier wafer 20 may be single crystal material, and include silicon containing material. For example, the carrier wafer may include a bulk silicon wafer.

Then, the device wafer 10 and the carrier wafer 20 may be bonded together by the bonding pattern 12. That is, a wafer bonding process may be performed. At this time, to improve adhesion between the two wafers, another bonding pattern (not illustrated) having the same shape as the bonding pattern 12 may be formed on the carrier wafer 20. In another embodiment, another bonding layer (not illustrated) may be formed on the front side of the carrier wafer 20. The additional bonding pattern and the bonding layer each may include an insulating material.

As the device wafer 10 and the carrier wafer 20 are bonded to each other, a cavity 14 may be formed in each of the die regions by the two wafers 10 and 20 and the bonding pattern 12.

Then, a thinning process may be performed on the back side of the device wafer 10, to reduce the thickness of the device wafer 10. Hereafter, reference numeral 10A represents the device wafer 10 having a reduced thickness obtained through the thinning process.

Then, a color filter (not illustrated) and a microlens (not illustrated) may be sequentially formed on the back side of the device wafer 10A at a location corresponding to each of the photoelectric conversion elements.

Figure 4D:
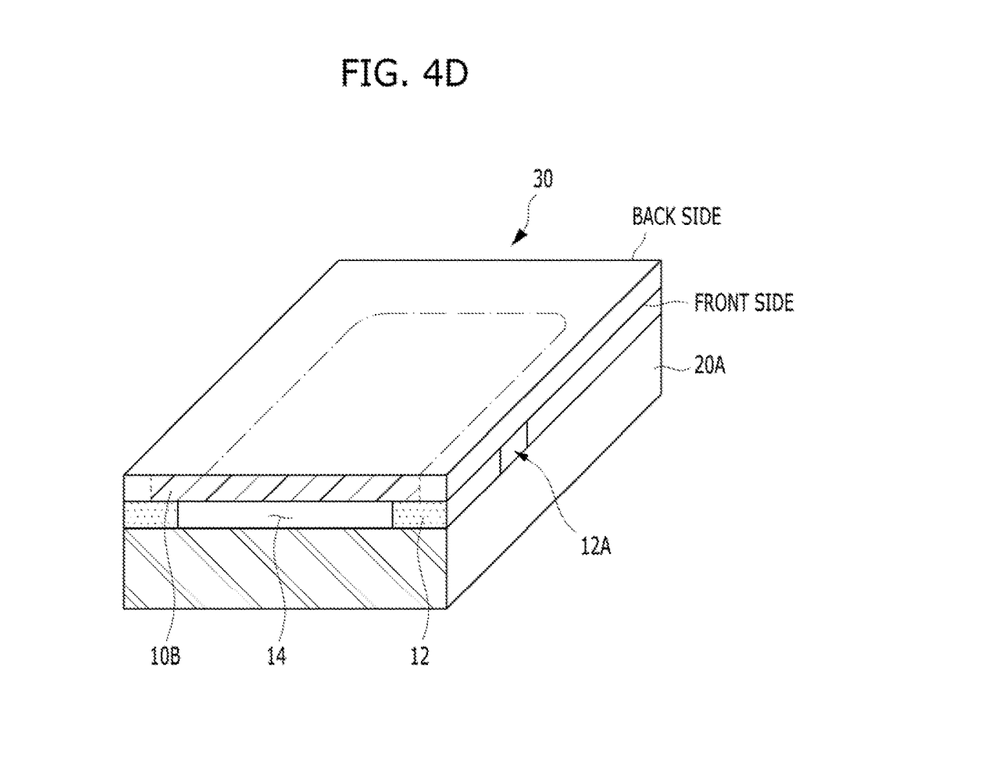

As illustrated in FIG. 4D, a sawing process for isolating the plurality of dies 30 may be performed along the scribe lane. At this time, the sawing process may expose the openings 12A at a sidewall of each of the isolated dies 30. Hereafter, the carrier wafer 20 and the device wafer 10A after the sawing process will be referred to as a second substrate 20A and a first substrate 10B, respectively.

Each of the dies 30 isolated through the sawing process may include the second substrate 20A, the bonding pattern 12, and the first substrate 10B which are sequentially stacked. The cavity 14 may be positioned in the bonding pattern 12. The openings 12A extending from the cavity 14 may be exposed to outside through the sidewall of the die 30.

Before the sawing process is performed, a thinning process may be performed on the carrier wafer 20.

Figure 4E:
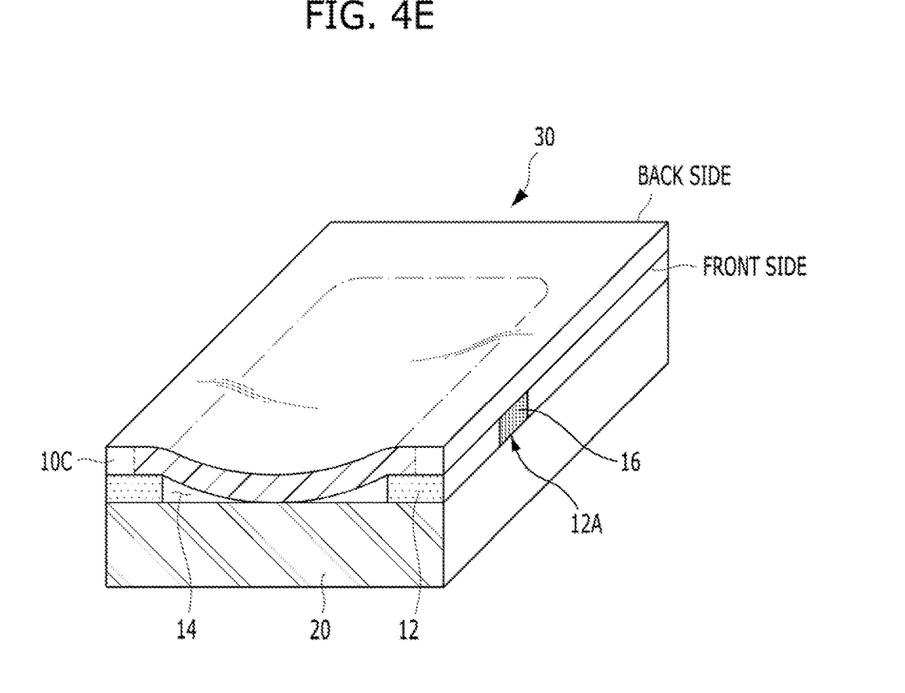

As illustrated in FIG. 4E, the plurality of dies 30 may be loaded into a chamber, and internal pressure of the chamber may be reduced. Then, the air filling the cavity 14 in each of the dies 30 may exhaust through the opening 12A to outside. Exhaustion of air causes pressure difference between the cavity 14 and the outside. As a result, the first substrate 10B bends toward the cavity 14. That is, the back side of the first substrate 10B is curved.

In a decompressed state, the opening 12A may be filled with a sealing material 16, thereby sealing the cavity 14 from outside. Even after the sealing process, a pressure difference may still exist between the cavity and the outside. Thus, the surface of the first substrate 10B is maintained in the curved state. In another embodiment, before the cavity 14 is sealed, a filler (not illustrated) may be injected into the cavity through the opening 12A.

Through the above-described process, the curved image sensor in accordance with the embodiment may be completed. Then, a conventionally known packaging process may be performed to complete a device or module including the curved image sensor.

As all of the processes of the method for fabricating the curved image sensor in accordance with an embodiment are performed at a wafer level before the packaging process, the fabrication efficiency may be significantly increased. Furthermore, the size, particularly, the height and/or thickness of the package including the curved image sensor, may be effectively reduced.

The curved image sensor in accordance with an embodiment may be used in various electronic devices or systems. Hereafter, the case in which the curved image sensor in accordance with an embodiment is applied to a camera will be described with reference to FIG. 5.

Figure 5:
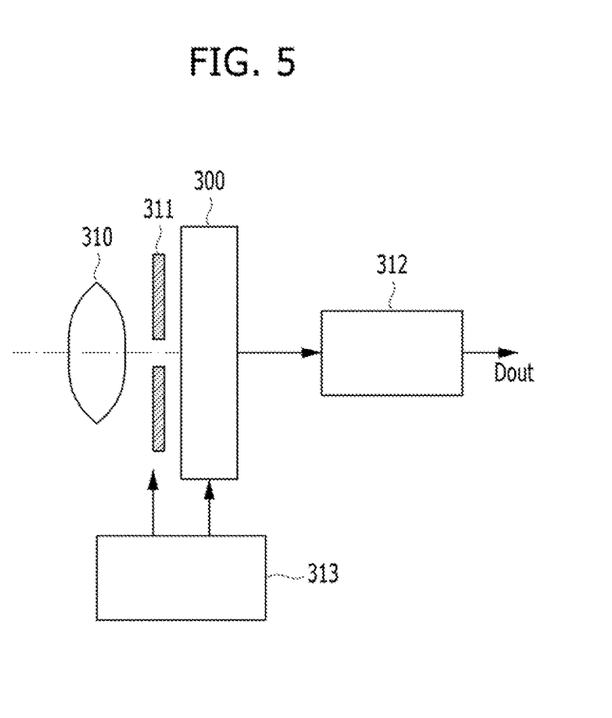
FIG. 5 is a diagram illustrating an electronic device including a curved image sensor in accordance with an embodiment.

FIG. 5 is a diagram illustrating an electronic device including a curved image sensor in accordance with an embodiment.

Referring to FIG. 5, the electronic device including a curved image sensor in accordance with an embodiment may include a camera capable of taking a still image or moving image. The electronic device may include a curved image sensor 300, an optical system or optical lens 310, a shutter unit 311, a driving unit for controlling/driving the curved image sensor 300 and the shutter unit 311, and a signal processing unit 312.

The optical system 310 may guide image light that is, incident light, from an object to the pixel array 2 (refer to FIG. 1) of the curved image sensor 300. The optical system 310 may include a plurality of optical lenses. The shutter unit 311 may control a light irradiation period and a light shielding period for the curved image sensor 300. The driving unit 313 may control a transmission operation of the curved image sensor 300 and a shutter operation of the shutter unit 311. The signal processing unit 312 may perform various types of signal processing operations on signals outputted from the curved image sensor 300. The processed image signals Dout may be stored in a storage medium such as a memory, or outputted to a monitor or the like.

In accordance with an embodiment, the curved image sensor using the bonding pattern for bonding the first and second substrates may provide fabrication efficiency.

Furthermore, as the curved image sensor is formed at the wafer level before the packaging process, the height, thickness or size of the package including the curved image sensor may be reduced.

What is claimed is:
1. A curved image sensor comprising:
    a first substrate including a plurality of photoelectric conversion elements and having a curved first surface;
    a bonding pattern formed over a second surface opposite to the first surface of the first substrate, formed along an edge of the first substrate, and having an opening;
    a second substrate bonded to the second surface of the first substrate by the bonding pattern; and
    a sealing material filling the opening so that a cavity defined by the first substrate, the second substrate, and the bonding pattern is sealed by the sealing material,
    wherein the bonding pattern comprises insulating material.
2. The curved image sensor of claim 1, further comprising a filler filling the cavity.
3. The curved image sensor of claim 1, wherein the first substrate comprises a device wafer, and the second substrate comprises a carrier wafer.
4. The curved image sensor of claim 1, wherein the bonding pattern has a donut shape.
5. The curved image sensor of claim 1, wherein an outer wall of the bonding pattern is aligned with sidewalls of the first and second substrates, and
    wherein an inner wall of the bonding pattern forms a polygonal shape in which all corners are rounded.

6. The curved image sensor of claim 1, wherein the opening passes through the bonding pattern in a direction parallel to an upper surface of the second substrate.

7. A curved image sensor comprising:
a first substrate including a plurality of photoelectric conversion elements and having a curved first surface;
a bonding pattern formed over a second surface opposite to the first surface of the first substrate, formed along an edge of the first substrate, and having an opening;
a second substrate bonded to the second surface of the first substrate by the bonding pattern;
a logic circuit layer extending between the second substrate and the bonding pattern to between the second substrate and the first substrate;
a connector formed in the bonding pattern and suitable for electrically connecting the first substrate and the logic circuit layer; and
a sealing material filling the opening to seal a cavity defined by the first substrate, the second substrate, and the bonding pattern,
wherein the bonding pattern comprises insulating material.

8. The curved image sensor of claim 7, further comprising a filler filling the cavity.

9. The curved image sensor of claim 7, wherein the first substrate comprises a device wafer, and the second substrate comprises a carrier wafer.

10. The curved image sensor of claim 7, wherein the bonding pattern has a donut shape.

11. The curved image sensor of claim 7, wherein an outer wall of the bonding pattern is aligned with sidewalls of the first and second substrates, and
wherein an inner wall of the bonding pattern forms a polygonal shape in which all corners are rounded.

12. The curved image sensor of claim 7, wherein the opening passes through the bonding pattern in a direction parallel to an upper surface of the second substrate.

13. A method for fabricating a curved image sensor, comprising:
preparing a device wafer having a die region, a neighboring die region, and a scribe lane, wherein the scribe lane is provided between the die region and the neighboring die region;
forming a plurality of photoelectric conversion elements in the die region;
forming a bonding pattern over a front surface of the device wafer, wherein the bonding pattern is formed along an edge of the die region and includes an opening;
bonding the front surface of the device wafer to a carrier wafer by the bonding pattern to form a cavity in the die region, wherein the cavity is defined by the device wafer, the carrier wafer, and the bonding pattern;
performing a sawing process to separate the die region from the neighboring die region; and
curving the device wafer of the separated die region,
wherein the forming of the bonding pattern comprises:
forming an insulating layer over the front surface of the device wafer; and
selectively etching the insulating layer to form the bonding pattern,
wherein the bonding pattern is formed over the scribe lane and over the edge of the die region.

14. The method of claim 13, wherein the bonding pattern has a donut shape.

15. The method of claim 13, wherein the opening passes through the bonding pattern in a direction parallel to an upper surface of the carrier wafer.

16. The method of claim 13, wherein the sawing process is performed to expose the opening to outside.

17. The method of claim 13, wherein the curving of the device wafer of the separated die region comprises:
removing air from the cavity to reduce pressure in the cavity; and
sealing the cavity by filling the opening with a sealing material.

18. The method of claim 13, further comprising:
filling the cavity with a filler, before the sealing of the cavity.

19. An electronic device comprises:
an optical system;
a curved image sensor suitable for receiving light from the optical system;
a shutter unit suitable for controlling light irradiated from the optical system to the curved image sensor;
a driving unit suitable for controlling an operation of the shutter unit and a transmission operation of the curved image sensor; and
a signal processing unit suitable for processing a signal outputted from the curved image sensor,
wherein the curved image sensor comprises:
a first substrate including a plurality of photoelectric conversion elements and having a curved first surface;
a bonding pattern formed over a second surface opposite to the first surface of the first substrate, formed along an edge of the first substrate, and having an opening;
a second substrate bonded to the second surface of the first substrate by the bonding pattern; and
a sealing material filling the opening so that a cavity defined by the first substrate, the second substrate, and the bonding pattern is sealed by the sealing material,
wherein the bonding pattern comprises insulating material.

20. The electronic device of claim 19, further comprising:
a logic circuit layer extending between the second substrate and the bonding pattern to between the second substrate and the first substrate; and
a plurality of connectors formed in the bonding pattern and suitable for electrically connecting the first substrate and the logic circuit layer.

21. The electronic device of claim 19, further comprising:
a filler filling the cavity.

* * * * *